United States Patent
Julicher et al.

(10) Patent No.: US 8,908,823 B2
(45) Date of Patent: Dec. 9, 2014

(54) DIGITAL PERIOD DIVIDER

(71) Applicant: Microchip Technology Incorporated, Chandler, AZ (US)

(72) Inventors: Joseph Julicher, Maricopa, AZ (US); Kevin Kilzer, Chandler, AZ (US); Cobus Van Eeden, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 14/200,317

(22) Filed: Mar. 7, 2014

(65) Prior Publication Data

US 2014/0270048 A1    Sep. 18, 2014

Related U.S. Application Data

(60) Provisional application No. 61/777,704, filed on Mar. 12, 2013.

(51) Int. Cl.
*G01P 3/00* (2006.01)
*H03K 23/00* (2006.01)

(52) U.S. Cl.
CPC .................................. *H03K 23/00* (2013.01)
USPC ............................................ 377/39; 702/145

(58) Field of Classification Search
USPC ........................................... 377/39; 702/145
See application file for complete search history.

(56) References Cited

U.S. PATENT DOCUMENTS

| | | | | |
|---|---|---|---|---|
| 4,166,976 A * | 9/1979 | Ruhnau et al. | | 324/166 |
| 4,408,290 A | 10/1983 | Kubo et al. | | 702/141 |
| 6,621,242 B2 * | 9/2003 | Huang et al. | | 318/268 |
| 7,835,883 B2 * | 11/2010 | Takeuchi | | 702/145 |
| 2008/0255796 A1 | 10/2008 | Takeuchi | | 702/147 |

FOREIGN PATENT DOCUMENTS

JP    2009294199 A    12/2009    ............. G01P 3/489

OTHER PUBLICATIONS

International Search Report and Written Opinion, Application No. PCT/US2014/022188, 11 pages, Jun. 27, 2014.

* cited by examiner

*Primary Examiner* — Patrick O'Neill
(74) *Attorney, Agent, or Firm* — King & Spalding L.L.P.

(57) ABSTRACT

A digital period divider has a first counter with R least significant bits (LSB) and P most significant bits (MSB) having a count input and a reset input, wherein the count input receives a first clock signal and the reset input receives a second clock signal; a latch having P bits and being coupled with the P bits of the first counter; a second counter having P bits and a count input and a reset input, wherein the count input receives the first clock signal; and a first comparator operable to compare the P bits of the latch with the P bits of the second counter and generating an output signal, wherein the output signal is also fed to the reset input of the second counter.

20 Claims, 4 Drawing Sheets

DIGITAL PERIOD DIVIDER

CROSS-REFERENCE TO RELATED APPLICATIONS

This application claims the benefit of U.S. Provisional Application No. 61/777,704 filed on Mar. 12, 2013, which is incorporated herein in its entirety.

TECHNICAL FIELD

The present disclosure relates to a digital period divider.

In digital applications there is often a need for precisely divide an unknown frequency. For example a frequency determined by the rotation of motor needs to be divided into 360 steps wherein each step indicates a rotation of one degree. Other signals such a power mains signal frequency of 50 or 60 Hz may need a similar processing.

SUMMARY

According to various embodiments, a digital period divider may comprise a first counter comprising R least significant bits (LSB) and P most significant bits (MSB) having a count input and a reset input, wherein the count input receives a first clock signal and the reset input receives a second clock signal; a latch having P bits and being coupled with the P bits of the first counter; a second counter having P bits comprising a count input and a reset input, wherein the count input receives the first clock signal; and a first comparator operable to compare the P bits of the latch with the P bits of the second counter and generating an output signal, wherein the output signal is also fed to the reset input of the second counter.

According to a further embodiment, the first counter may comprise an MSB counter and an LSB counter connected in series. According to a further embodiment, the LSB counter can be a modulo counter and the modulo can be 180 or 360. According to a further embodiment, the LSB counter can be coupled with a first input of a modulo comparator having a second input coupled with a modulo register, wherein an output of the modulo comparator rests the LSB counter and clocks the MSB counter. According to a further embodiment, the first clock signal can be a known system clock and the second clock signal is a signal having an unknown frequency smaller than the system clock.

According to another embodiment, a system may comprise the digital period divider as described above, and further comprise a third counter having P bits and comprising a reset input and a count input, wherein the reset input receives the second clock signal and the count input receives the output signal of the first comparator; a user value register; a second comparator operable to compare the value of the third counter and the user value register; and a flip-flop having a set and reset input, wherein the set input receives the first clock signal and the reset input receives an output signal of the second comparator.

According to a further embodiment of the system, the second clock signal can be generated by a sensor coupled with a motor. According to a further embodiment of the system, the sensor generates at least one pulse per full rotation of the motor shaft. According to a further embodiment of the system, the sensor is a Hall or optical sensor.

According to yet another embodiment, a method for dividing a period of an unknown frequency, comprises: Receiving a series of index pulses; Measuring a time between two successive index pulses by means of a first counter having P most significant bits and R least significant bits and being clocked by a system clock; Latching the most significant bits, and Comparing the latched value with a second counter being clocked by the system clock and generating a output pulses when the second counter is equal to the latched most significant bits.

According to a further embodiment of the method, the first counter may comprise an MSB counter and an LSB counter connected in series. According to a further embodiment of the method, the LSB counter can be a modulo counter and the modulo can be 80 or 360. According to a further embodiment of the method, the LSB counter can be coupled with a first input of a modulo comparator having a second input coupled with a modulo register, wherein an output of the modulo comparator resets the LSB counter and clocks the MSB counter. According to a further embodiment of the method, the first clock signal can be a known system clock and the second clock signal is a signal having an unknown frequency smaller than the system clock. According to a further embodiment of the method, the method may further comprise: Generating a pulse width modulation (PWM) signal from the output pulses. According to a further embodiment of the method, the index pulse can be generated by a rotary machine, and wherein the measured period is a period of rotation. According to a further embodiment of the method, the method may comprise: clocking a third counter having P bits with the index pulses and resetting the third counter with the output pulses; compare a value of the third counter with a user value; and setting a flip-flop with the index pulses and resetting the flip-flop when the third counter is equal the user value. According to a further embodiment of the method, the index pulses can be generated by a sensor coupled with a motor. According to a further embodiment of the method, the sensor may generate at least one pulse per full rotation of a motor shaft. According to a further embodiment of the method, the sensor can be a Hall or optical sensor.

According to yet another embodiment, a microcontroller may comprise a central processing unit (CPU); a configurable timer unit comprising a plurality of timers; a configurable capture/compare unit; configurable logic cells; wherein the CPU is operable to configure the timers, capture/compare unit and logic cells to form the digital period divider or system as described above.

According to a further embodiment of the microcontroller, the microcontroller may further comprise a programmable internal routing logic operable to assign input and output signals to the timer unit, capture/compare unit and/or logic cells.

DETAILED DESCRIPTION

Figure 1:
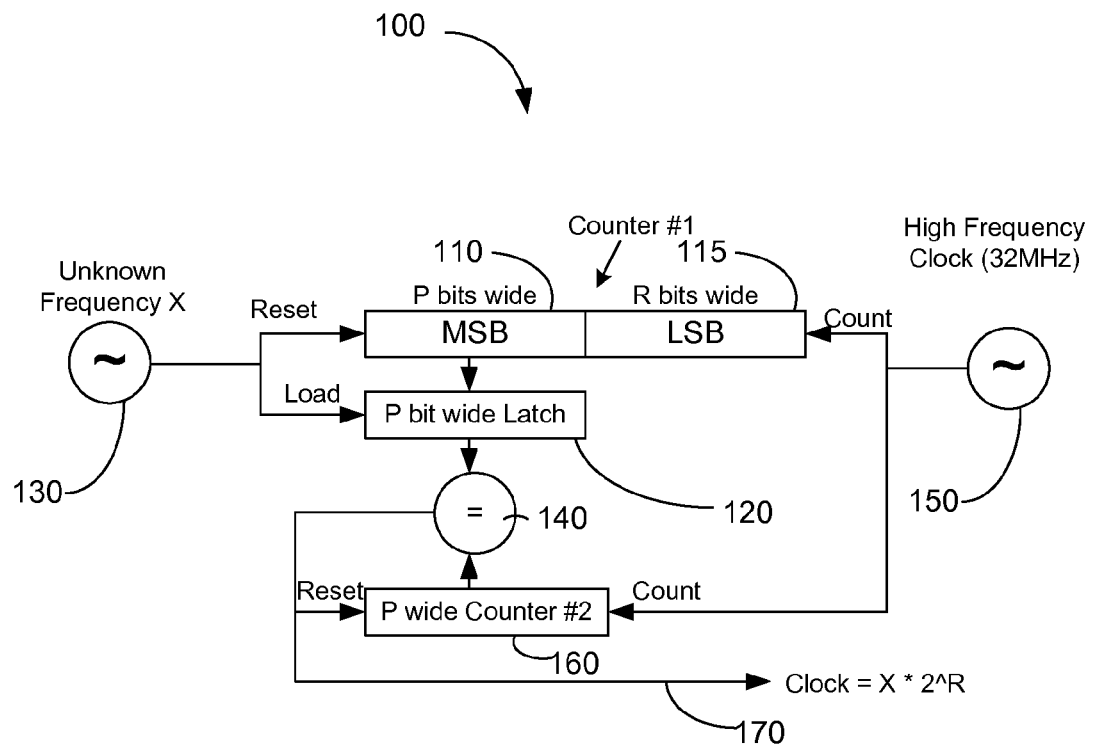
FIG. 1 shows a block diagram of a digital period divider according to various embodiments.

FIG. 1 shows a block diagram of a digital period divider according to various embodiments. A first counter can be formed by two counters 110 and 115 wherein the first counter having P bits concatenates with a second counter 115 having R bits. Thus, counter 110 provides the most significant bits (MSB) and counter 115 the least significant bits (LSB). However, according to other embodiments a single counter having P+R bits may be used. In case two counters are used, the overflow of counter 115 clocks the input of counter 110. A high frequency clock source 150 is provided, for example a 32 MHz system clock, that provides the count clock input signal for the first counter 110, 115. The first counter (or the combined counters 110, 115) have a reset input that receives the unknown frequency X from a frequency source 130. A latch 120 having P bits is coupled with counter 110 and therefore with the MSB of the first counter. The unknown frequency triggers the load input of latch 120. A second counter 160 having P bits receives the clock signal of the system clock at its count input. A comparator 140 is provided that compares the value of the latch 120 and the count value of the second counter 160. If equal, the output of comparator 140 goes high (or low) and may be used to reset the second counter. Also, the output signal of comparator provides the divided clock signal $X*2^R$.

It is widely accepted that sine, cosine and tangent computations are necessary when controlling rotary machines, but according to various embodiments a rotation pulse-to-angle conversions is provided.

Figure 2:
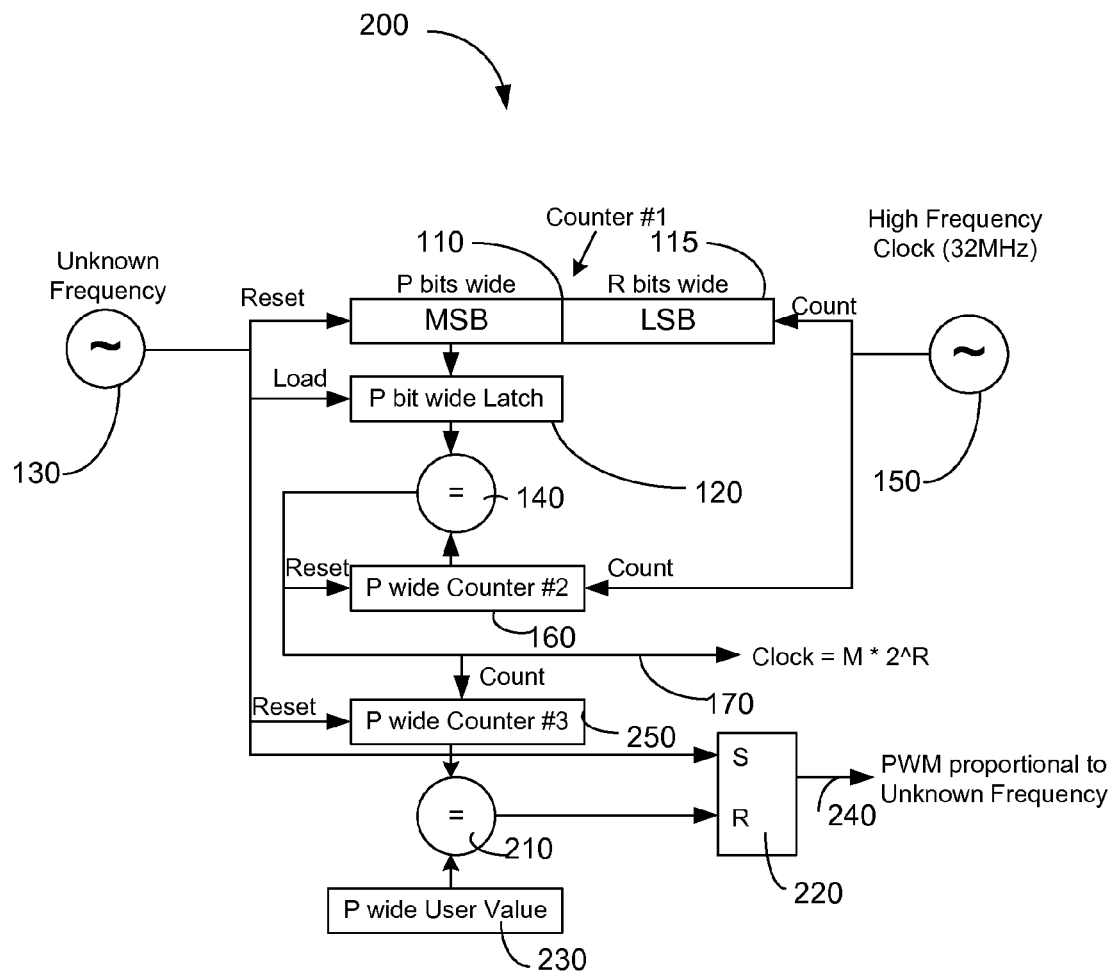
FIG. 2 shows a first application embodiment using the period divider of FIG. 1.

Referring to FIG. 2, a first application of the period divider shown in FIG. 1 is provided. As mentioned above, an unknown frequency having a period M, for example of a motor or other rotary machine, is provided to the period divider. The circuit 110, 115, 120, 140, 150, and 160 measures the period of rotation, and (b) creates a clock that is a fixed multiple of the rotational frequency. Typically, this might be one clock per degree of rotation (that is, times 360), or any convenient multiple. The machine may be applied to motor systems or to systems like AC power lines with a frequency of 50 or 60 Hz or any other unknown frequency signal.

With reference to the FIG. 2, the machine requires 2 inputs. The unknown frequency input, for example motor-pulse, supplies a reference indicating in case of a motor that the motor has turned one revolution. Such a signal can be obtained for example from a Hall-effect sensor or optical interrupter as will be discussed in more detail below. Some applications may supply more than one pulse per revolution, and for discussion we take this as M cps (cycles per second). The other input is a fixed clock source of any convenient frequency, as long as it is much faster than the expected output signal. For example, a 6000 RPM motor produces an input of 100 cps, and if the machine is set to multiply by 360 (one clock per degree of rotation), the output will be 36000 Hz. The clock source of 32 MHz is almost 1000× faster, so is adequate.

As mentioned above, the first counter can be actually two counters 115 and 110 according to some embodiments. Counter 115 advances with each clock pulse, and is illustrated having R bits for a modulo $2^R$ count. The counter 115 could be any modulo, like 360 or 180, and for discussion we say that counter 115 has modulo R. Counter 120 holds P bits and advances every time counter 115 rolls over. Taken together, these counters 115, 110 count the number of clock pulses required for 1 revolution of the motor. With each revolution, the present value of counter 120 is captured in the latch 120, and the entire first counter 115, 110 is reset to zero. Mathematically, the latch 120 receives a value which is the total number of clock pulses per revolution divided by R, updated with every cycle of the unknown frequency. The size of the counter 110 (value of P) must be chosen to prevent counter overflow knowing period M and the clock frequency. Simultaneously, the second counter 160 advances with each clock pulse, and counts until it reaches a value equal to the latched value. When equal, the equality logic 140 emits a single pulse and the second counter 160 resets to zero. As will be appreciated, the second counter 160 will do this a total of R times before the latched value changes, and so there will be R equality pulses emitted for each cycle of the unknown signal, for example the motor rotation signal. Thus, the goal of producing at the output 170 a clock train R times faster than the motor index pulse has been achieved, and the new clock train will change frequency as often as the motor speed changes, albeit one cycle later. The latency can be improved by configuring the motor to produce many pulses per revolution, and reducing R proportionately.

Also shown in the picture is a third counter 250, a user-value register 230 for storing a value UV, and an SR latch 220. This represents logic that is similar to a conventional timer with PWM arrangement, except with the added ability to reset the third counter 250 with every cycle of the unknown signal from source 130. Since the third counter 250 is clocked R times per revolution, the counter value will advance from zero to (R−1) within each cycle of the unknown signal. In case the unknown signal is provided by a motor, assuming that the motor speed is relatively constant, the counter will be equal to the user value at a rotation angle of 360*(UV/R) degrees after the index pulse. It is highly significant that the user value UV is proportional to degrees, independent of the motor speed. This allows UV to represent an angle directly, without the sine, cosine or tangent computations normally required for conversion from the fixed-time measurements of traditional timers and PWMs to angular measurements (or vice versa). For AC power system, a value of UV=90 (degrees) would produce the same angular index regardless of whether a 50, 60 or even 400 Hz power system is being used.

Figure 3:
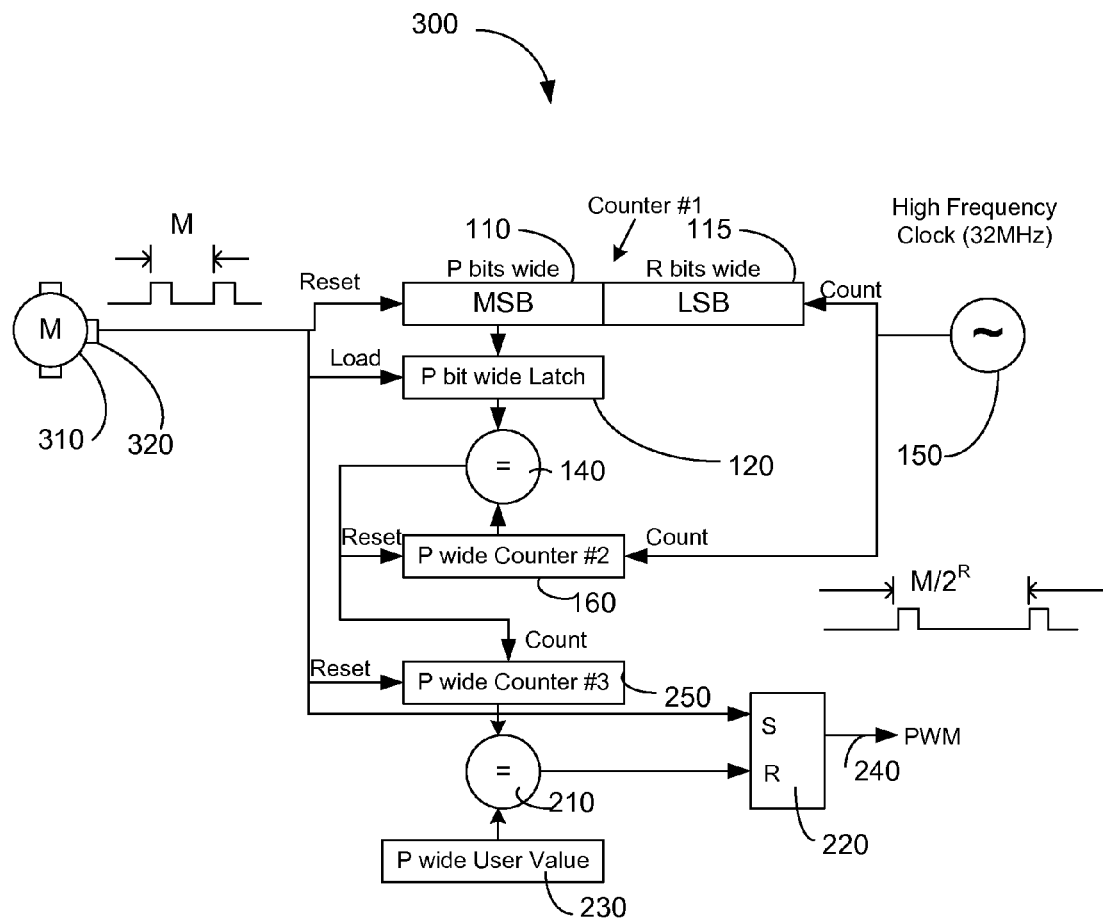
FIG. 3 shows another application using a period divider of FIG. 1.

FIG. 3 shows an example with a motor 310 comprising, for example, a sensor 320, for example a Hall sensor or optical sensor, capable of generating a pulse with each rotation of the motor shaft. This signal is used as the unknown frequency signal and fed to the period divider of FIG. 1 and the additional logic discussed in the embodiment of FIG. 2. Here, the reset signal generated by comparator logic 140 is only used to clock counter 250. Flip-flop 220 comprises output 240 which provides for a user controlled pulse width modulation signal which can be directly controlled by a value proportional to the rotation degree.

The arrangements shown in the figures can be preferably realized within a microcontroller. To this end, a flexible timer comparator unit may be provided that allows for the shown arrangements. To this end, latch 120 may be formed by a capture unit coupled with a first counter and programmable routing may be provided that allows to compare the various values as shown in FIG. 3. For example, control registers within the microcontroller may allow to assign inputs of digital comparators to be assigned to timers or capture latches. Moreover, the microcontroller may include programmable logic, such as configurable logic cells that provide for combinatorial logic or various types of flip-flops or latches such as D flip-flop, JK flip-flop or SR latches. Such microcontrollers are manufactured by Applicant for example in the PIC10F32x and PIC1xF150X family.

Figure 4:
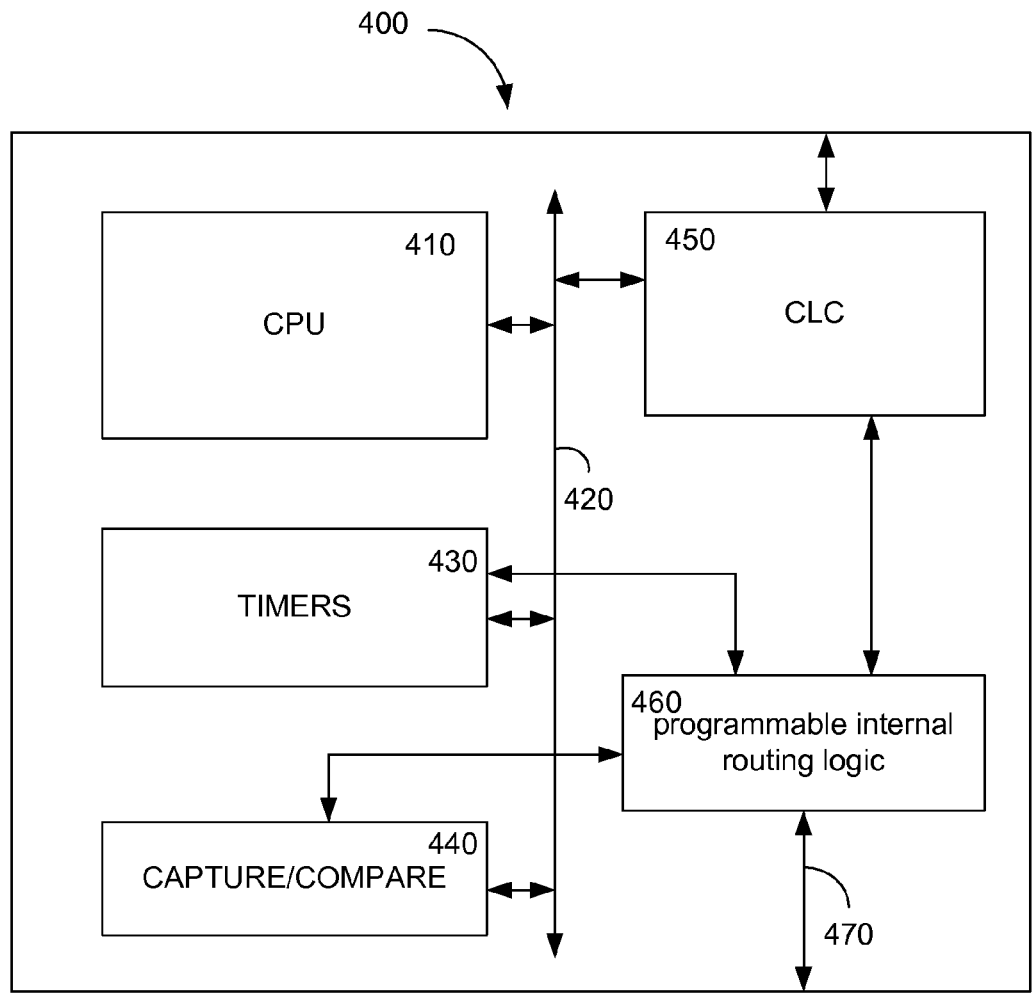
FIG. 4 shows a microcontroller designed to embody the period divider according to various embodiments.

FIG. 4 shows an exemplary microcontroller 400 designed to be able to be programmed to form the functional units as shown in FIG. 1-3. Microcontroller 400 comprises a central processing unit 410 connected with an internal bus 420. Various peripherals such as timers 430, a capture compare unit 440 and configurable logic cells 450 may be available and coupled with the internal bus 420. in additional each peripheral may have programmable glue logic that allows to route internal signals to its various inputs, for example, internal or external signals may clock a timer. Two timers may be programmable to form a single concatenated timer, timer values may be coupled with inputs of the capture/compare unit, etc. Alternatively a central programmable internal routing logic 460 may be provided that allows for the same function namely to assign the various internal or external signals to various inputs/outputs of the peripheral devices. The various peripherals may have special function registers that allow the selection of the various input/output signals. Even if a programmable internal routing logic 460 is provided, such special function registers may be provided to control the unit 460 wherein the special function registers may be associated with the respective peripheral unit. Thus, the unit 460 may not be visible to a user. Thus, without any additional hardware, a period divider and/or additional logic as discussed above can be formed within the microcontroller 400 under program control.

Figure 5:
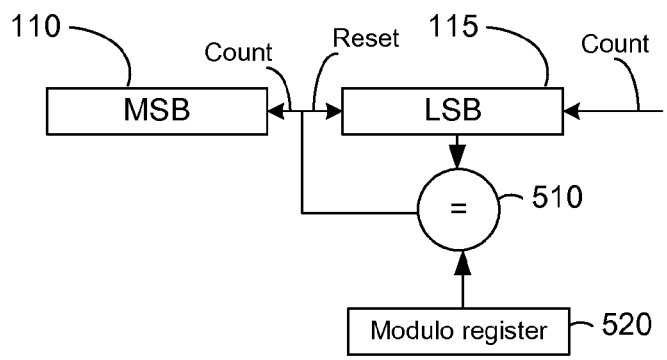
FIG. 5 shows an embodiment for a modulo counter which can be used as the LSB counter of the first counter of the period divider.

FIG. 5 shows an example of a modulo counter with a variable modulo. To this end, a modulo register 520 is provided which can be programmed to contain the modulo value. A modulo comparator 510 compares the value of LSB counter 115 with the value of the modulo register 520 and generates a pulse each time the values are equal. This pulse is used to reset LSB counter 115 and clock MSB counter 110. The modulo register 520 can be, for example, programmed to store a value of 180 or 360 or any other suitable value for dividing the period of the unknown frequency.

The various embodiments disclosed can be used for commutation of motor windings, generating a pulse of fixed fraction, for example as a type of pulse width modulation, switching something on at a specific fraction such as persistence of vision propeller displays, the timing of output changes during sine wave generation, which, for example, may use a digital-to-analog converter and does not have to use pulse width modulation, etc.

What is claimed is:

1. A digital period divider comprising:
    a first counter comprising R least significant bits (LSB) and P most significant bits (MSB) having a count input and a reset input, wherein the count input receives a first clock signal and the reset input receives a second clock signal;
    a latch having P bits and being coupled with the P bits of the first counter;
    a second counter having P bits comprising a count input and a reset input, wherein the count input receives the first clock signal; and
    a first comparator operable to compare the P bits of the latch with the P bits of the second counter and generating an output signal, wherein the output signal is also fed to the reset input of the second counter.

2. The digital period divider according to claim 1, wherein the first counter comprises an MSB counter and an LSB counter connected in series.

3. The digital period divider according to claim 2, wherein the LSB counter is a modulo counter.

4. The digital period divider according to claim 3, wherein the modulo is 180 or 360.

5. The digital period divider according to claim 1, wherein the first clock signal is a known system clock and the second clock signal is a signal having an unknown frequency smaller than said system clock.

6. A system comprising the digital period divider according to claim 1, and further comprising:
    a third counter having P bits and comprising a reset input and a count input, wherein the reset input receives the second clock signal and the count input receives the output signal of the first comparator;
    a user value register;
    a second comparator operable to compare the value of the third counter and the user value register; and
    a flip-flop having a set and reset input, wherein the set input receives the first clock signal and the reset input receives an output signal of the second comparator.

7. The system according to claim 6, wherein the second clock signal is generated by a sensor coupled with a motor.

8. The system according to claim 7, wherein the sensor generates at least one pulse per full rotation of the motor shaft.

9. The system according to claim 8, wherein the sensor is a Hall or optical sensor.

10. A method for dividing a period of an unknown frequency, comprising:
    Receiving a series of index pulses;
    Measuring a time between two successive index pulses by means of a first counter having P most significant bits and R least significant bits and being clocked by a system clock;
    Latching the most significant bits, and
    Comparing the latched value with a second counter being clocked by the system clock and generating a output pulses when said second counter is equal to said latched most significant bits.

11. The method according to claim 10, wherein the first counter comprises an MSB counter and an LSB counter connected in series.

12. The method according to claim 11, wherein the LSB counter is a modulo counter.

13. The method according to claim 12, wherein the modulo is 180 or 360.

14. The method according to claim 11, wherein the first clock signal is a known system clock and the second clock signal is a signal having an unknown frequency smaller than said system clock.

15. The method according to claim 10, further comprising Generating a pulse width modulation (PWM) signal from the output pulses.

16. The method according to claim 15, comprising clocking a third counter having P bits with said output pulses and resetting the third counter with said index pulses;
    compare a value of the third counter with a user value; and
    setting a flip-flop with said index pulses and resetting the flip-flop when said third counter is equal said user value.

17. The method according to claim 16, wherein the index pulses are generated by a sensor coupled with a motor.

18. The method according to claim 17, wherein the sensor generates at least one pulse per full rotation of a motor shaft.

19. The method according to claim 18, wherein the sensor is a Hall or optical sensor.

20. The method according to claim 10, wherein the index pulse is generated by a rotary machine, and wherein the measured period is a period of rotation.

* * * * *